(12) United States Patent
Hori et al.

(10) Patent No.: US 9,761,567 B2
(45) Date of Patent: Sep. 12, 2017

(54) POWER SEMICONDUCTOR MODULE AND COMPOSITE MODULE (71) Applicant: FUJI ELECTRIC CO., LTD., Kawasaki-shi (JP)

(72) Inventors: Motohito Hori, Matsumoto (JP); Yoshinari Ikeda, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/150,938

(22) Filed: May 10, 2016

(65) Prior Publication Data

US 2016/0254255 A1 Sep. 1, 2016

Related U.S. Application Data (63) Continuation of application No. PCT/JP2015/060340, filed on Apr. 1, 2015.

(30) Foreign Application Priority Data

May 15, 2014 (JP) ................................. 2014-101423

(51) Int. Cl.
*H01L 23/02* (2006.01)
*H01L 23/22* (2006.01)
(Continued)

(52) U.S. Cl.
CPC .......... *H01L 25/115* (2013.01); *H01L 23/049* (2013.01); *H01L 23/053* (2013.01);
(Continued)

(58) Field of Classification Search
CPC . H01L 2224/13013; H01L 2224/13014; H01L 2224/131; H01L 2224/13147;
(Continued)

(56) References Cited

U.S. PATENT DOCUMENTS 4,127,840 A * 11/1978 House ................... G01L 9/0055
257/419
5,041,899 A * 8/1991 Oku ....................... H01L 23/057
257/691

(Continued)

FOREIGN PATENT DOCUMENTS

JP S58-175650 U 11/1983
JP S63-132448 U 8/1988
(Continued)

OTHER PUBLICATIONS

PCT, "International Search Report for International Application No. PCT/JP2015/060340".
(Continued)

*Primary Examiner* — Teresa M Arroyo
(74) *Attorney, Agent, or Firm* — Manabu Kanesaka (57) ABSTRACT

A power semiconductor module includes a wiring member that electrically connects a front surface electrode of a semiconductor element and a circuit board of an insulating substrate in a housing. A resin provided in the housing covers the wiring member, and has a height in the vicinity of the wiring member. A cover covering the periphery of external terminals is provided between the resin and a first lid in the housing. A second lid is provided further outside the first lid in an aperture portion of the housing, and the space between the second lid and the first lid is filled with another resin.

15 Claims, 4 Drawing Sheets

(51) Int. Cl.
| | |
|---|---|
| *H01L 23/48* | (2006.01) |
| *H01L 23/52* | (2006.01) |
| *H01L 23/06* | (2006.01) |
| *H01L 23/29* | (2006.01) |
| *H01L 25/11* | (2006.01) |
| *H01L 25/07* | (2006.01) |
| *H01L 25/18* | (2006.01) |
| *H01L 23/049* | (2006.01) |
| *H01L 23/16* | (2006.01) |
| *H01L 23/31* | (2006.01) |
| *H01L 23/40* | (2006.01) |
| *H01L 23/492* | (2006.01) |
| *H01L 23/498* | (2006.01) |
| *H01L 23/538* | (2006.01) |
| *H01L 23/053* | (2006.01) |
| *H01L 23/367* | (2006.01) |
| *H01L 23/00* | (2006.01) |
| *H01L 23/15* | (2006.01) |
| *H01L 23/373* | (2006.01) |
| *H01L 23/24* | (2006.01) |

(52) U.S. Cl.
CPC .......... *H01L 23/16* (2013.01); *H01L 23/3121* (2013.01); *H01L 23/4006* (2013.01); *H01L 23/48* (2013.01); *H01L 23/4924* (2013.01); *H01L 23/49805* (2013.01); *H01L 23/49833* (2013.01); *H01L 23/49838* (2013.01); *H01L 23/5386* (2013.01); *H01L 24/16* (2013.01); *H01L 24/49* (2013.01); *H01L 24/73* (2013.01); *H01L 25/07* (2013.01); *H01L 25/18* (2013.01); *H01L 23/15* (2013.01); *H01L 23/24* (2013.01); *H01L 23/3675* (2013.01); *H01L 23/3735* (2013.01); *H01L 23/49861* (2013.01); *H01L 23/49866* (2013.01); *H01L 24/13* (2013.01); *H01L 24/29* (2013.01); *H01L 24/32* (2013.01); *H01L 24/81* (2013.01); *H01L 2023/4087* (2013.01); *H01L 2224/131* (2013.01); *H01L 2224/13013* (2013.01); *H01L 2224/13014* (2013.01); *H01L 2224/13147* (2013.01); *H01L 2224/16237* (2013.01); *H01L 2224/16257* (2013.01); *H01L 2224/291* (2013.01); *H01L 2224/32225* (2013.01); *H01L 2224/32227* (2013.01); *H01L 2224/48091* (2013.01); *H01L 2224/48137* (2013.01); *H01L 2224/48227* (2013.01); *H01L 2224/73253* (2013.01); *H01L 2224/73265* (2013.01); *H01L 2224/81424* (2013.01); *H01L 2224/81447* (2013.01); *H01L 2224/81801* (2013.01); *H01L 2924/00014* (2013.01); *H01L 2924/00015* (2013.01); *H01L 2924/10253* (2013.01); *H01L 2924/10272* (2013.01); *H01L 2924/1203* (2013.01); *H01L 2924/12032* (2013.01); *H01L 2924/13055* (2013.01); *H01L 2924/13091* (2013.01); *H01L 2924/15747* (2013.01); *H01L 2924/17747* (2013.01); *H01L 2924/181* (2013.01); *H01L 2924/351* (2013.01); *H01L 2924/3511* (2013.01)

(58) Field of Classification Search
CPC ..... H01L 2224/291; H01L 2224/32225; H01L 2224/48227; H01L 2224/73265; H01L 2224/81424; H01L 2224/81447; H01L 2224/81801; H01L 2224/45015; H01L 2224/45099; H01L 2224/48; H01L 2224/16237; H01L 2224/16257; H01L 2224/32227; H01L 2224/48137; H01L 2224/73253; H01L 2924/00014; H01L 2924/014; H01L 2924/00015; H01L 2924/181; H01L 2924/00; H01L 2924/00012; H01L 2924/207; H01L 2924/10253; H01L 2924/10272; H01L 2924/1203; H01L 2924/12032; H01L 2924/13055; H01L 2924/13091; H01L 2924/15747; H01L 2924/17747; H01L 2924/351; H01L 2924/3511; H01L 2023/4087; H01L 23/049; H01L 23/053; H01L 23/15; H01L 23/16; H01L 23/24; H01L 23/3121; H01L 23/3675; H01L 23/3735; H01L 23/4006; H01L 23/48; H01L 23/4924; H01L 23/49805; H01L 23/49833; H01L 23/49838; H01L 23/49861; H01L 23/49866; H01L 23/5386; H01L 24/13; H01L 24/16; H01L 24/29; H01L 24/32; H01L 24/49; H01L 24/73; H01L 24/81; H01L 25/07; H01L 25/115; H01L 25/18; D06F 2058/287; D06F 58/10; D06F 58/20; D06F 58/206; D06F 58/28; F25B 27/02
USPC .............. 257/678, 685, 691, 692, 704, 787, 257/E23.079
See application file for complete search history.

(56) References Cited

U.S. PATENT DOCUMENTS

| | | | | |
|---|---|---|---|---|
| 5,257,547 | A * | 11/1993 | Boyer | G01L 19/0038 338/4 |
| 5,268,533 | A * | 12/1993 | Kovacs | H01L 23/04 174/524 |
| 7,166,910 | B2 * | 1/2007 | Minervini | B81B 7/0064 257/704 |
| 7,202,552 | B2 * | 4/2007 | Zhe | B81C 1/0023 257/659 |
| 7,608,789 | B2 * | 10/2009 | Kruger | H01L 23/3121 174/255 |
| 7,692,292 | B2 * | 4/2010 | Higashi | H01L 23/04 257/704 |
| 8,325,951 | B2 * | 12/2012 | Wang | H04R 19/005 381/175 |
| 8,385,569 | B2 * | 2/2013 | Hachinohe | B81B 7/0061 381/189 |
| 2004/0046245 | A1 * | 3/2004 | Minervini | B81B 7/0064 257/704 |
| 2006/0091512 | A1 * | 5/2006 | Shinohara | H01L 23/49562 257/678 |
| 2007/0075417 | A1 * | 4/2007 | Hwang | B81B 7/0077 257/704 |
| 2009/0039498 | A1 * | 2/2009 | Bayerer | H01L 23/3735 257/700 |
| 2009/0213553 | A1 * | 8/2009 | Tschirbs | H01L 23/053 361/709 |
| 2011/0248389 | A1 * | 10/2011 | Yorita | H01L 23/3677 257/659 |
| 2014/0124907 | A1 * | 5/2014 | Park | H01L 25/105 257/659 |
| 2014/0203424 | A1 * | 7/2014 | Shimanouchi | B23K 1/0016 257/704 |

FOREIGN PATENT DOCUMENTS

| | | |
|---|---|---|
| JP | H10-270608 A | 10/1998 |
| JP | H11-003995 A | 1/1999 |
| JP | 2003-068979 A | 3/2003 |
| JP | 2012-105382 A | 5/2012 |

(56) References Cited

FOREIGN PATENT DOCUMENTS

| | | |
|---|---|---|
| JP | 2012-119618 A | 6/2012 |
| JP | 2012-238684 A | 12/2012 |

OTHER PUBLICATIONS

Japan Patent Office, "Office Action for Japanese Patent Application No. 2016-519154," dated Mar. 14, 2017.

* cited by examiner

POWER SEMICONDUCTOR MODULE AND COMPOSITE MODULE

CROSS-REFERENCE TO RELATED APPLICATIONS

This is a continuation application of PCT International Application No. PCT/JP2015/060340 filed on Apr. 1, 2015, which claims a priority of Japanese Patent Application No. 2014-101423 filed on May 15, 2014.

TECHNICAL FIELD

The present invention relates to a power semiconductor module, and to a composite module in which a plurality of power semiconductor modules is combined.

BACKGROUND ART

A power semiconductor module generally includes an insulating substrate on which a semiconductor chip acting as a semiconductor element is mounted. The semiconductor chip and a circuit board of the insulating substrate are electrically connected using a joining material such as solder, and via bonding wire or a conductive plate. The insulating substrate and the semiconductor chip are housed in a housing. An external terminal electrically connected to the insulating substrate in the housing extends further outward from the housing. The inside of the housing is sealed with a sealing material in order to increase insulation.

Figure 4:
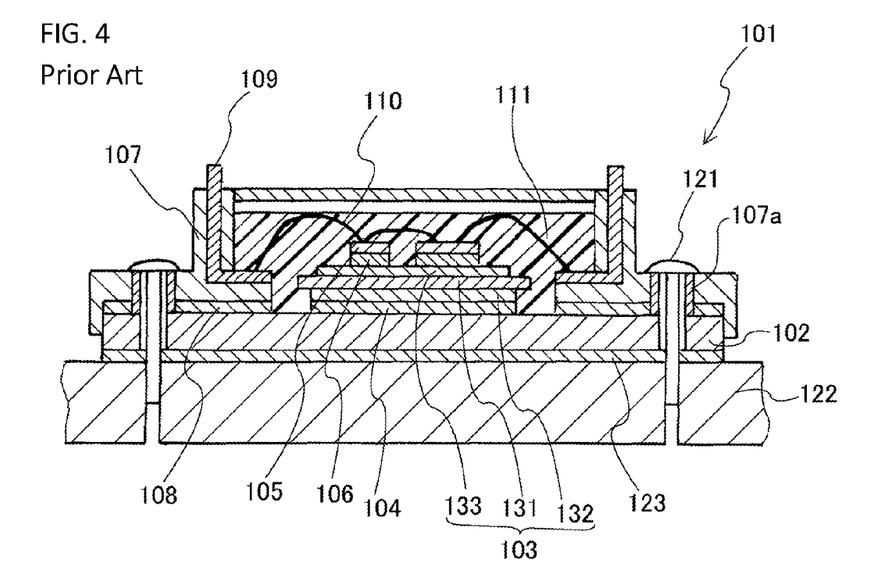
FIG. 4 is a sectional view of an example of an existing power semiconductor module.

An example of an existing power semiconductor module is shown as a sectional view in FIG. 4.

A power semiconductor module 101 shown in FIG. 4 includes a metal base plate 102. An insulating substrate 103 is joined using a joining material 104 to the top of the base plate 102. The insulating substrate 103 includes an insulating plate 131, a metal plate 132 provided on one surface of the insulating plate 131, and a circuit board 133 which is provided on the other surface of the insulating plate 131 which forms a predetermined circuit. An example of insulating substrate 103 is a DCB (Direct Copper Bond) substrate.

A semiconductor chip 105 such as an IGBT (insulated gate bipolar transistor) is electrically and mechanically connected using a conductive joining material 106 to the circuit board 133.

A frame body 107 is provided on the periphery of the base plate 102, and joined using a joining material 108. In this way, a housing of the power semiconductor module 101 is formed. An external terminal 109 extending from the inner side to the outer side of the frame body 107 is integrated with the frame body 107. The external terminal 109 and an electrode on a front surface of the semiconductor chip 105 are electrically connected by a bonding wire 110.

The semiconductor chip 105 and the insulating substrate 103 are housed in a space enclosed by the frame body 107, and the space is filled with a sealing material 111. In this way, mutual isolation of the semiconductor chip 105, the insulating substrate 103, the base plate 102, and the external terminal 109 is secured.

A screw hole 107a is provided in the frame body 107. The power semiconductor module 101 is fixed to a cooling member 122 by inserting a screw 121 into the screw hole 107a and screwing into the cooling member 122. Heat radiating grease 123 is applied between the base plate 102 and the cooling member 122, whereby heat from the semiconductor chip 105 is efficiently transferred to the cooling member 122 via the insulating substrate 103. A thermally conductive sheet is sometimes used instead of the heat radiating grease 123.

Also, it has been proposed that a plurality of heretofore described kind of power semiconductor modules is connected in parallel using a bus bar (PTL 1).

A thermosetting resin such as an epoxy resin is sometimes used as the sealing member 111 which is filled inside the housing in order to improve the insulating performance of the heretofore described kind of power semiconductor module 101. Meanwhile, if a large amount of thermosetting resin is used in the housing as the sealing material 111, thermal stress is exerted when there is a thermal history in assembling the power semiconductor module 101, a temperature change in the external environment in using the power semiconductor module 101, or the like. This is because the linear coefficient of the thermosetting resin and the linear coefficients of other members differ considerably. Further, there is concern that breakage of the bonding wire 110, deformation of the base plate 102 or the frame body 107, or the like will occur due to the thermal stress.

Breakage of the bonding wire 110 causes an immediate failure of the power semiconductor module 101. Also, the degree of adhesion to the cooling member 122 decreases due to deformation of the base plate 102 or the frame body 107, whereby thermal resistance increases. Also, there is concern that an increase in thermal resistance will lead to a rise in the temperature of the semiconductor chip 105, causing a reduction in the long-term reliability of the power semiconductor module 101. Also, using a large amount of thermosetting resin also leads to a rise in cost and an increase in weight of the power semiconductor module 101.

There is a power semiconductor device in which a gel-form resin, for example silicone resin, is injected into a housing in two separate layers, wherein a first resin layer is injected as far as a position in which the resin does not contact an auxiliary lead terminal, and hardened (PTL 2). Also, there is a power semiconductor device in which a space is formed between the upper surface of a gel filling the interior of a receptacle and the lower surface of a sealing plate corresponding to an upper lid of the receptacle, and furthermore, an external terminal hole provided in the sealing plate is blocked with a hard resin (PTL 3).

However, the thermal resistance of the gel-form silicone resin used in PTL 2 and PTL 3 is inferior to that of a thermosetting resin. Also, the insulation of the silicone resin is not always sufficient in a power semiconductor module with high breakdown voltage. Also, the structure in PTL 3 in which the sealing plate hole is blocked with a hard resin is complex in the shape of the sealing plate, because of which the manufacturing cost rises.

CITATION LIST

Patent Literature

PTL 1: JP-A-2012-105382
PTL 2: JP-A-10-270608
PTL 3: JP-A-2003-68979

SUMMARY OF INVENTION

Technical Problem

The invention, having been contrived in order to advantageously resolve the heretofore described problems, has an object of providing a high breakdown voltage power semiconductor module in which insulation is high, and furthermore, deformation and the like of a base plate or frame body can be restricted, thereby increasing long-term reliability, and a composite module in which a multiple of the power semiconductor modules are combined.

Solution to Problem

A power semiconductor module of one aspect of the invention includes a housing having an aperture portion, a circuit board housed in an interior of the housing, a semiconductor element that has an electrode on a front surface, a back surface being fixed to the circuit board, a wiring member that electrically connects the electrode of the semiconductor element and the circuit board, a first lid fixed in the aperture portion of the housing, a second lid fixed in the aperture portion of the housing and provided further outside the first lid, a first resin disposed between the first lid and second lid, a second resin covering the wiring member and having an exposed surface, the exposed surface being located closer to the wiring member relative to the first lid, an external terminal having one end electrically and mechanically connected to the circuit board and the other end protruding further outside the second lid, and a cover that covers the external terminal and is disposed between the exposed surface of the second resin and the first lid.

A composite module of another aspect of the invention includes a plurality of heretofore described power semiconductor modules, and includes a bus bar unit that electrically connects the external terminals of the power semiconductor modules to each other.

Advantageous Effects of Invention

According to the power semiconductor module and the composite module of the invention, in a high breakdown voltage power semiconductor module, insulation is high, and furthermore, deformation and the like of a base plate or case is restricted, and long-term reliability is high.

DESCRIPTION OF EMBODIMENTS

Hereafter, a specific description will be given, while referring to the drawings, of embodiments of a power semiconductor module of the invention. The term "electrically and mechanically connected" used in the description in the present application is not limited to a case where target objects are connected by direct joining, but also includes a case where target objects are connected via a conductive joining material such as solder or a metal sintering material.

Embodiment 1

Figure 1:
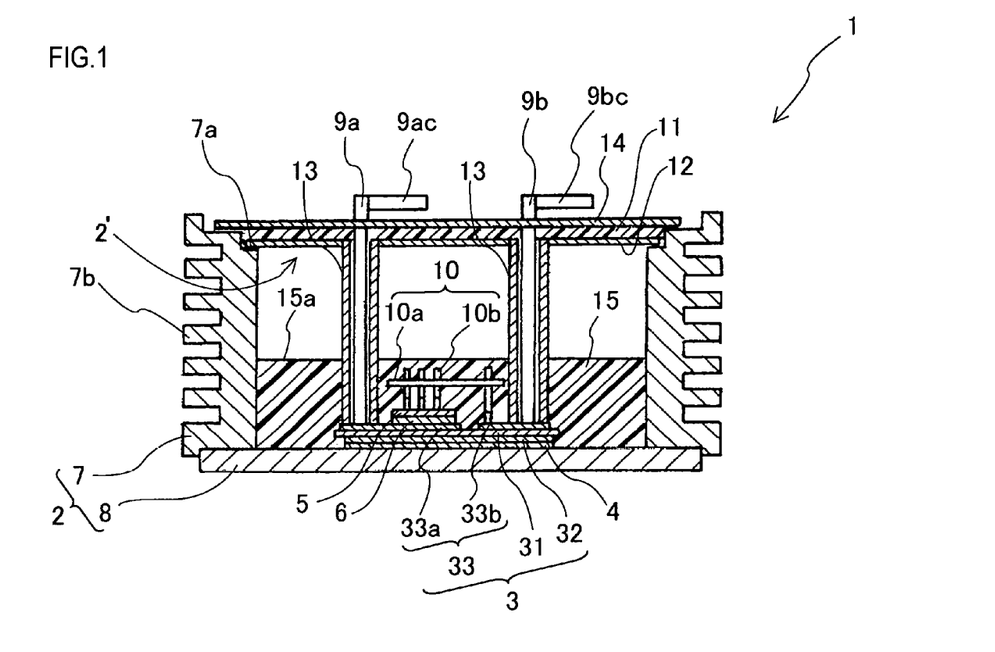
FIG. 1 is a sectional view of a power semiconductor module of Embodiment 1 of the invention.

FIG. 1 is a sectional view of a power semiconductor module of Embodiment 1 of the invention. The power semiconductor module of this embodiment is a so-called 1-in-1 module, and has a circuit in which a switching element and a freewheeling diode are connected in anti-parallel.

The power semiconductor module 1 of the embodiment shown in FIG. 1 includes a housing 2 having a base plate 8 and frame body 7, a circuit board 33 which is one portion of an insulating substrate 3, a semiconductor chip 5 acting as a semiconductor element, a wiring member 10, a first lid 12, a second lid 14, a first resin 11, a second resin 15, an external terminal 9 (9a, 9b), and a cover 13.

The heat radiating metal base plate 8 has an approximately quadrangular planar form. The insulating substrate 3 is joined to the top of the base plate 8. As shown in FIG. 1, the insulating substrate 3 includes an insulating plate 31, a metal plate 32 provided on one surface of the insulating plate 31, and a circuit board 33 which is provided on the other surface of the insulating plate 31 and on which a predetermined circuit is formed. The metal plate 32 of the insulating substrate 3 is joined to the main surface of the base plate 8 using a joining material 4 such as solder. The insulating plate 31 is made of an insulating ceramic such as, for example, aluminum nitride, silicon nitride, or aluminum oxide, while the metal plate 32 and circuit board 33 are made of, for example, copper. Further, in the example shown in the drawing, the circuit board 33 has circuit boards 33a and 33b on which the predetermined circuits are formed. A DCB substrate, or the like in which the insulating substrate 31 is directly joined to the metal plate 32 and the circuit board 33 can be used as the insulating substrate 3.

An electrode is provided on each of the front surface and the back surface of the semiconductor chip 5. Further, the back surface electrode is electrically and mechanically connected to the circuit board 33a via a conductive joining material 6 such as solder. Specifically, the semiconductor chip 5 is, for example, a Schottky barrier diode, a power MOSFET (Metal Oxide Semiconductor Field Effect Transistor), or an IGBT (Insulated Gate Bipolar Transistor). The semiconductor chip 5 may be formed of a silicon semiconductor, or may be formed of a SiC semiconductor. When the semiconductor chip 5 is an IGBT, the back surface electrode is a collector electrode, while the front surface electrodes are an emitter electrode and a gate electrode. When the semiconductor chip 5 is a power MOSFET formed of silicon carbide (SiC), a breakdown voltage is higher, and switching is possible at a higher frequency, than in the case of a semiconductor chip formed of silicon, because of which a power MOSFET formed of silicon carbide is optimal as the semiconductor chip 5 of the power semiconductor module of this embodiment. Of course, the semiconductor chip 5 is not limited to an IGBT or power MOSFET, but it is sufficient that the semiconductor chip 5 is a semiconductor element capable of a switching operation, or a combination of a multiple of such semiconductor elements.

The frame body 7 is provided on the peripheral edge of the base plate 8. The frame body 7 has a frame form, and is made of a resin having good insulation, thermal resistance, and moldability, for example, an epoxy resin, PPS (Polyphenylene Sulfide), PBT (Polybutylene Terephthalate), or the like. Also, the frame body 7 may be ceramic. A lower end portion of the frame body 7 is joined with adhesive to the peripheral edge of the main surface of the base plate 8, whereby the housing 2 of the power semiconductor module 1 is formed by the frame body 7 and base plate 8. The insulating substrate 3 and the semiconductor chip 5 are housed inside the housing 2. One end of each of the external terminals 9a and 9b is electrically and mechanically connected to the circuit boards 33a and 33b respectively in the frame 2. The other end of each of the external terminals 9a and 9b extends upward, protrudes further outward than the second lid 14, to be described hereafter, and forms each of connection portions 9ac and 9bc.

The wiring member 10 is provided in the power semiconductor module 1. The wiring member 10 includes a conductive plate 10a and a conductive post 10b. The conductive plate 10a is provided to face the semiconductor chip 5 and the circuit board 33 of the insulating substrate 3. Further, one end of the conductive post 10b is electrically and mechanically connected to a second electrode of the semiconductor chip 5 or the circuit board 33 of the insulating substrate 3, while the other end is electrically and mechanically connected to the conductive plate 10a.

For example, a front surface electrode of the semiconductor chip 5 and the circuit board 33b are electrically connected by the wiring member 10. In this embodiment, it is preferable that the wiring member is the wiring member 10 including the conductive plate 10a and the conductive post 10b, rather than a bonding wire. In this embodiment, as will be described hereafter, the second resin 15, which is injected into the frame body 7, is a thermosetting resin. Therefore, when the wiring member is a bonding wire, there is concern that the bonding wire will break due to the difference between the linear coefficient of the thermosetting resin and that of other members. As opposed to this, when the wiring member includes the conductive plate 10a and the conductive post 10b, no breakage or the like occurs even when using the thermosetting second resin 15, and excessive deformation of the base plate 8 and the frame body 7 can be avoided, whereby long-term reliability and high insulation performance can be balanced. When the semiconductor chip 5 is, for example, an IGBT, the wiring member 10 electrically connects the emitter electrode of the front surface electrodes and the circuit board 33b of the insulating substrate 3. Also, the wiring member 10 electrically connects the gate electrode of the front surface electrodes and a circuit board 33c (not shown) of the insulating substrate 3.

The conductive plate 10a and the conductive post 10b are made of, for example, copper, which has good conductivity. Also, when necessary, plating can be applied to the surfaces of the conductive plate 10a and the conductive post 10b. A cylindrical form, a rectangular parallelepiped form, or the like, can be adopted as the external form of the conductive post 10b, but the external form is not particularly limited. A bottom surface of the conductive post 10b is of a smaller size than the front surface electrodes of the semiconductor chip 5. Furthermore, as the number of conductive posts 10b which is provided with respect to one semiconductor chip 5 is arbitrary, and a plurality of conductive posts 10b can be joined to one front surface electrode.

The conductive plate 10a and the conductive post 10b are electrically and mechanically connected by solder or brazing. As the wiring member 10 in which the conductive plate 10a and the conductive post 10b are integrated in advance is used, a manufacturing process of the power semiconductor module 1 can be simplified.

Also, the conductive plate 10a, not being limited to a copper plate, may be a circuit substrate in which a metal layer made of a conductive metal such as copper or aluminum is formed on at least one surface of an insulating plate. When the conductive plate 10a is a circuit substrate, a configuration having at least two metal layers is preferable. One layer is a metal layer for electrically connecting the emitter electrode of the front surface electrodes of the semiconductor chip 5 and the circuit board 33b of the insulating substrate 3. The other layer is a metal layer for electrically connecting the gate electrode of the front surface electrodes of the semiconductor chip 5 and the circuit board 33c (not shown) of the insulating substrate 3.

The second resin 15 is injected into the housing 2, and the insulating substrate 3, the semiconductor chip 5, and the wiring member 10 are sealed, whereby an exposed surface 15a of the second resin 15 is formed. In view of having high insulation and being able to withstand use in high temperatures, a thermosetting resin is adopted as the second resin 15, and an epoxy resin, for example, is preferable. The second resin 15 covers the wiring member 10, and is injected to a height in the vicinity of the upper end of the wiring member 10. Specifically, the exposed surface 15a is disposed at a height in the region of 1 mm higher than the upper end of the wiring member 10. For example, when the height from the upper surface of the base plate 8 to the upper end of the wiring member 10 is in the region of 10 mm, it is good that the exposed surface 15a is at a height in the region of 11 mm from the upper surface of the base plate 8. The larger the amount of second resin 15 injected, the more likely thermal stress caused by the second resin 15 is to occur inside the housing 2, and the long-term reliability of the power semiconductor module decreases. A large amount of the second resin 15 being injected is also disadvantageous in terms of cost and weight reduction. Therefore, in this embodiment, the amount of second resin 15 injected is the minimum needed to cover the wiring member 10. Therefore, deformation of the power semiconductor module 1 is restricted, while an increase in cost and an increase in weight of the power semiconductor module 1 can be avoided. Also, by forming the wiring member by the conductive plate 10a and the conductive post 10b, as previously described, the height of the upper end of the wiring member can be controlled more accurately than in an existing example in which the wiring is a bonding wire. Therefore, the amount of second resin 15 injected can be controlled to the necessary and minimum amount, as previously described, which is advantageous.

It is sufficient that a region above the exposed surface 15a inside the housing 2 is a space. By providing a space in this region and securing a distance between the base plate 8 and the connection portions 9ac and 9bc of the external terminal, the high breakdown voltage characteristic of the power semiconductor module 1 can be secured. Also, as another example, insulation can also be secured by injecting a sealing material other than the sealing material made of resin, for example, a gel-form sealing material, into the region above the second resin 15.

The first lid 12 is provided so as to be engaged with a stepped portion 7a provided in the frame body 7 and to cover an aperture portion 2' of the housing 2. The first lid 12 is made of a resin having good insulation, thermal resistance, and moldability, for example, an epoxy resin, PPS, PBT, or the like. The first lid 12 may be ceramic. Also, holes are provided in the first lid 12, and the external terminals 9a and 9b are passed through the holes.

The cover 13 is provided in the space between the first lid 12 and the exposed surface 15a of the second resin 15 so as to cover the periphery of the external terminal 9. In one example, the cover 13 is of a hollow cylindrical form, in which the inner diameter is of a size such that the external terminals 9a and 9b can be inserted. The cover 13 is made of a resin having good insulation, thermal resistance, and moldability, for example, an epoxy resin, PPS, PBT, or the like. The upper end of the cover 13 comes into contact with the first lid 12, while there is no particular preference regarding the position of the lower end, provided that the lower end reaches the inside of the second resin 15. In the example shown in FIG. 1, the lower end of the cover 13 reaches the circuit board 33. Also, as another example, the lower end of the cover 13 is disposed in the vicinity of the exposed surface 15a of the second resin 15 in the example shown in FIG. 3.

Owing to the external terminals 9a and 9b being covered with the cover 13 in the space between the first lid 12 and the second resin 15, the external terminals 9a and 9b are no longer exposed in the space, and insulation is maintained. Therefore, the high breakdown voltage characteristic of the power semiconductor module 1 can be secured. Also, as the combination of the first lid 12 and cover 13 does not have the kind of complex form of the sealing plate described in PTL 3, manufacture is easy, and the manufacturing cost is kept low.

The second lid 14 is provided further toward the outside of the housing 2 than the first lid 12. The second lid 14, in the same way as the first lid 12, is made of a resin having good insulation, thermal resistance, and moldability, for example, an epoxy resin, PPS, PBT, or the like. Also, the second lid 14 may be ceramic. In the same way as in the first lid 12, holes are provided in the second lid 14, and the external terminals 9a and 9b are passed through.

The space between the first lid 12 and the second lid 14 is filled with the first resin 11. In the same way as the second resin 15, the first resin 11 is a thermosetting insulating resin with high insulation, and an epoxy resin is preferable.

Since the space between the first lid 12 and the second lid 14 is filled with the first resin 11, the high breakdown voltage characteristic of the power semiconductor module 1 can be improved. Also, the first resin 11 with which the space is filled is disposed so as to contact with the external terminals 9a and 9b. Further, the first resin 11 is disposed so as to fill holes through which the external terminals 9a and 9b are inserted provided in the first lid 12 and the second lid 14, and the gap between the external terminals 9a and 9b. Therefore, insulation between the interior of the housing 2 and the exterior of the power semiconductor module 1 can be secured, and the high breakdown voltage characteristic of the power semiconductor module 1 can be secured.

Furthermore, the first resin 11 can also fill a gap that may occur in a place in which the first lid 12 and the cover 13 come into contact, which is also advantageous for the high breakdown voltage characteristic. As it is sufficient that the first resin 11 has a thickness in the region of 1 mm between the second lid 14 and the first lid 12, the gap between the second lid 14 and first lid 12 is in the region of 1 mm.

Further still, the first resin 11 fills the gap between the first lid 12 and the second lid 14 and the frame body 7, and at the same time also functions as an adhesive that fixes the lids 12 and 14 to the frame body 7. Therefore, the high breakdown voltage characteristic can be secured, and there is no longer a need to prepare a separate adhesive to bond the lids and the frame body, because of which the manufacturing cost can be reduced.

In the power semiconductor module 1 of this embodiment, while long-term reliability is high, the amount of the second resin 15 made of a thermosetting resin with a large linear coefficient and large thermal stress is minimum needed to cover the wiring member 10. Further, since a space is provided between the second resin 15 and the aperture portion inside the housing 2, a creepage distance is secured. Also, since the external terminals 9a and 9b is covered by the cover 13 in the space, insulation in the vicinity of the external terminals 9a and 9b is secured. Furthermore, since the second lid 14 and the first lid 12 are provided, and the space between the second lid 14 and the first lid 12 are filled with the first resin 11, insulation at the aperture portion of the housing 2 is increased. Consequently, in the power semiconductor module 1 of this embodiment, high insulation can be obtained while maintaining long-term reliability.

The power semiconductor module 1 is fixed with screws or the like to a cooling member (not shown), in the same way as an existing power semiconductor module. Further, in order to obtain a long creepage distance between the earthed cooling member and external terminals, thereby increasing insulation, irregularities are provided in an outer surface 7b of the frame body 7 in this embodiment. These irregularities, together with the heretofore described configuration, contribute to the high breakdown voltage characteristic of the power semiconductor module 1. According to this embodiment, a power semiconductor module provided with an extremely high voltage breakdown characteristic, that is a breakdown voltage of, for example, 13 kV or higher, is obtained. The voltage breakdown characteristic of the power semiconductor module 1 is determined by the height from the cooling member to the connection portions 9ac and 9bc of the external terminals 9a and 9b. Therefore, it is sufficient to adjust a gap between the second resin 15 and the first lid 12 as necessary, and provide external terminals 9a and 9b of the necessary length, in accordance with the desired voltage breakdown characteristic.

Embodiment 2

Figure 2:
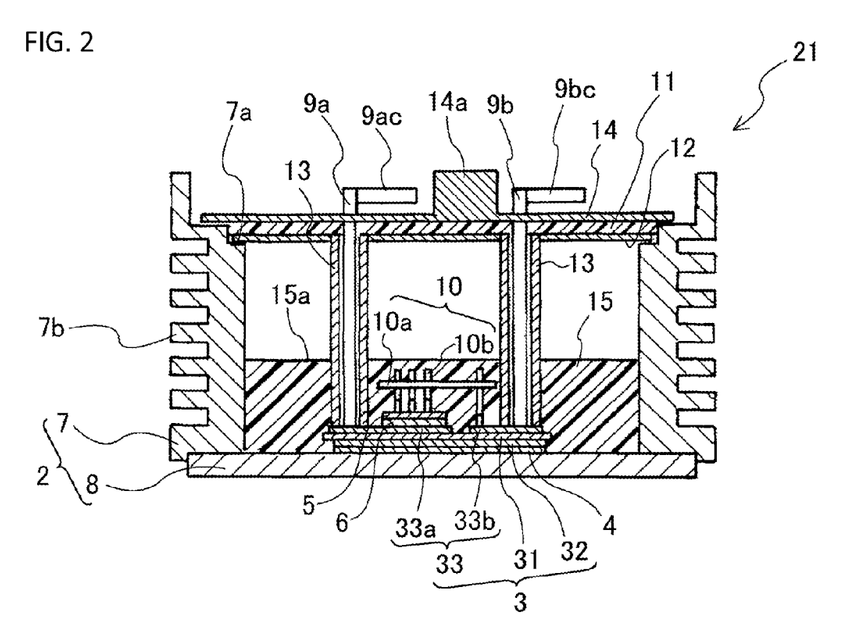
FIG. 2 is a sectional view of a power semiconductor module of Embodiment 2.

FIG. 2 shows a sectional view of a power semiconductor module of Embodiment 2 of the invention. In FIG. 2, members same as in the power semiconductor module 1 of Embodiment 1 shown in FIG. 1 are assigned by the same reference signs. Consequently, duplicate descriptions of the same members in the power semiconductor module 1 of Embodiment 1 shown in FIG. 1 are omitted from the description given hereafter of the power semiconductor module of Embodiment 2.

A power semiconductor module 21 of Embodiment 2 shown in FIG. 2 differs from the power semiconductor module 1 of Embodiment 1 shown in FIG. 1 in that a projection 14a of the second lid 14 is provided between the multiple of external terminals 9a and 9b (specifically, for example, a P terminal and an N terminal) protruding outward from the second lid 14. Since the projection 14a is provided, insulation between the external terminals 9a and 9b can be increased, as a result of which the insulation of the power semiconductor module 21 can be further increased.

Embodiment 3

Figure 3:
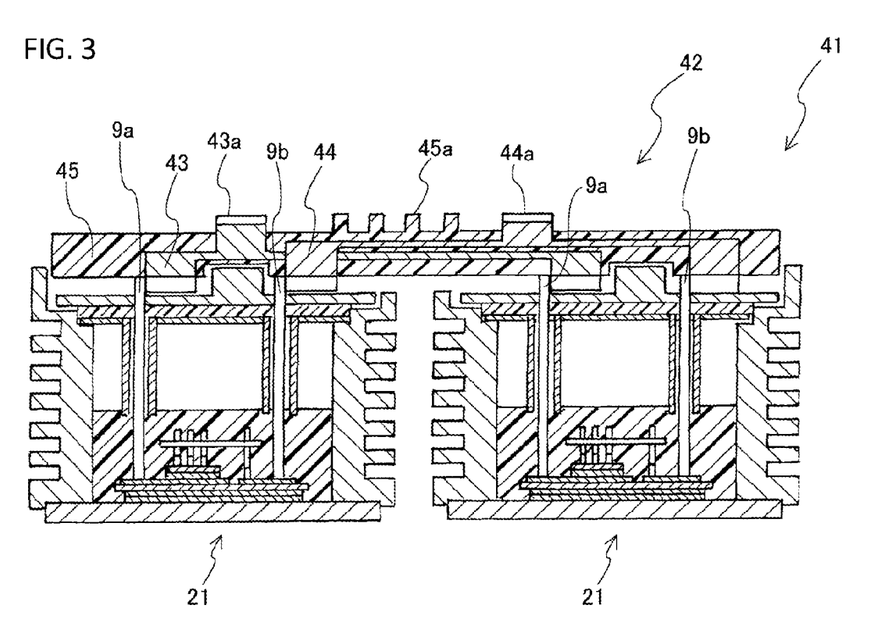
FIG. 3 is a sectional view of a composite module of Embodiment 3.

FIG. 3 shows a sectional view of a composite module of Embodiment 3 of the invention. In FIG. 3, members same as in the power semiconductor module 21 of Embodiment 2 shown in FIG. 2 are assigned by the same reference signs. Consequently, duplicate descriptions of the same members in the power semiconductor module 21 of Embodiment 2 are omitted from the description given hereafter of the composite module of Embodiment 3.

A composite module 41 shown in FIG. 3 includes two of the power semiconductor module 21. Further, the composite module 41 includes a bus bar unit 42 that electrically connects the corresponding identical external terminals 9a and 9b in the two power semiconductor modules 21. The bus bar unit 42 has a bus bar 43, which connects, for example, the P terminal external terminals 9a, and a bus bar 44, which connects the N terminal external terminals 9b, and is formed by the bus bars 43 and 44 integrally molded with an insulating mold resin 45. According to this configuration, a plurality of the power semiconductor modules 21, which is a 1-in-1 module, is connected in parallel, whereby a 1-in-1 module with increased rated current capacity is formed. Connection between the bus bar 43 and external terminal 9a and connection between the bus bar 44 and external terminal 9b are carried out by screwing, solder, laser welding, or the like. Also, the mold resin 45 is, for example, an epoxy resin, PPS, PBT, or the like. The bus bars 43 and 44 have terminal portions 43a and 44a respectively, which are electrically connected to an external device (not shown). Also, the bus bars 43 and 44 are disposed so as to partially overlap in an up-down direction with a gap of 1 mm or less. Therefore, when mutually opposing currents flow through the bus bars 43 and 44, the lines of magnetic force caused by the currents offset each other, whereby self-inductance can be reduced.

Also, an irregular portion 45a integrated with the mold resin 45 is provided between the terminal portions 43a and 44a in the bus bar unit 42. Insulation between the terminal portions 43a and 44a can be increased by the irregular portion 45a, as a result of which the insulation of the composite module 41 can be further increased.

Although, in the composite module 41 of this embodiment, a plurality of power semiconductor modules is connected in parallel, the bus bars of the bus bar unit can be disposed so that the power semiconductor modules are connected in series, in accordance with the application.

Heretofore, the power semiconductor module and composite module of the invention have been specifically described using the drawings and embodiments. However, the power semiconductor module and composite module of the invention are not limited to the descriptions in the embodiments and drawings. Modifications can be made without departing from the scope of the invention.

REFERENCE SIGNS LIST 1, 21 Power semiconductor module
2 Housing
3 Insulating substrate
31 Insulating plate
32 Metal plate
33 Circuit board
4, 6 Joining material
5 Semiconductor chip (semiconductor element)
7 Frame body
8 Base plate
9a, 9b External terminal
9ac, 9bc Connection portion
10 Wiring member
10a Conductive plate
10b Conductive post
11 First resin
12 First lid
13 Cover
14 Second lid
15 Second resin
15a Exposed surface
41 Composite module
42 Bus bar unit
43, 44 Bus bar
45 Mold resin

What is claimed is:

1. A power semiconductor module, comprising:
   a housing having an aperture portion and an interior;
   a circuit board housed in the interior of the housing;
   a semiconductor element having an electrode on a front surface, a back surface being fixed to the circuit board;
   a wiring member electrically connecting the electrode of the semiconductor element and the circuit board;
   a first lid covering the aperture portion of the housing;
   a second lid covering the first lid and provided further outside the first lid;
   a first resin disposed between the first lid and the second lid;
   a second resin covering the wiring member and having an exposed surface, the exposed surface being located closer to the wiring member than the first lid;
   an external terminal having one end electrically and mechanically connected to the circuit board, and another end protruding further outside the second lid; and
   a cover covering the external terminal, and disposed between the exposed surface of the second resin and the first lid.

2. The power semiconductor module according to claim 1, wherein the external terminal is sealed with the first resin between the first lid and the second lid.

3. The power semiconductor module according to claim 1, wherein the wiring member includes
   a conductive plate provided to face the semiconductor element and the circuit board, and
   a conductive post having one end electrically and mechanically connected to a second electrode of the semiconductor element or the circuit board, and another end electrically and mechanically connected to the conductive plate.

4. The power semiconductor module according to claim 1, wherein the housing has irregularities on an external side surface thereof.

5. The power semiconductor module according to claim 1, wherein the second lid has a projection between a plurality of external terminals protruding to an exterior.

6. The power semiconductor module according to claim 1, wherein the first resin and the second resin are thermosetting resins.

7. The power semiconductor module according to claim 1, wherein the cover is provided separately from an internal side surface of the housing.

8. The power semiconductor module according to claim 1, wherein the semiconductor element is a vertical semiconductor element having an another electrode on the back surface, and the another electrode and the circuit board are electrically and mechanically connected.

9. The power semiconductor module according to claim 1, wherein the housing includes a frame body and a base plate.

10. The power semiconductor module according to claim 9, wherein the circuit board is one portion of an insulating substrate, and the insulating substrate is fixed to the base plate.

11. The power semiconductor module according to claim 1, wherein the wiring member and the exposed surface are spaced by approximately 1 mm.

12. A composite module comprising a plurality of power semiconductor modules, each module comprising:
   a housing having an aperture portion and an interior;
   a circuit board housed in the interior of the housing;
   a semiconductor element having an electrode on a front surface, a back surface being fixed to the circuit board;

a wiring member electrically connecting the electrode of the semiconductor element and the circuit board;

a first lid covering the aperture portion of the housing;

a second lid covering the first lid and provided further outside the first lid;

a first resin disposed between the first lid and the second lid;

a second resin covering the wiring member and having an exposed surface, the exposed surface being located closer to the wiring member than the first lid;

an external terminal having one end electrically and mechanically connected to the circuit board, and another end protruding further outside the second lid; and a cover covering the external terminal, and disposed between the exposed surface of the second resin and the first lid; and a bus bar unit electrically connecting the external terminals of the power semiconductor modules to each other.

13. The composite module according to claim 12, wherein the bus bar unit is formed of a plurality of bus bars partially overlapping with a gap therebetween.

14. The composite module according to claim 13, wherein a gap between the plurality of bus bars in the bus bar unit is 1 mm or less.

15. The composite module according to claim 1, wherein a space between the second lid and the first lid is filled with the first resin.

* * * * *